United States Patent [19]
Tedrow et al.

[11] Patent Number: 5,559,717
[45] Date of Patent: Sep. 24, 1996

[54] HIGH PRECISION VOLTAGE DETECTOR UTILIZING FLASH EEPROM MEMORY CELLS

[75] Inventors: Kerry Tedrow, Orangevale; Joseph W. Tsang, Elk Grove; Kenneth Wojciechowski, Folsom, all of Calif.

[73] Assignee: Intel Corporation, Santa Clara, Calif.

[21] Appl. No.: 217,165

[22] Filed: Mar. 23, 1994

[51] Int. Cl.$^6$ .................................................. G11C 7/00
[52] U.S. Cl. .................................. 364/483; 365/189.07
[58] Field of Search .................................. 364/483, 481, 364/550; 365/189.01, 189.07, 201, 228, 900; 327/50, 57, 581; 323/311, 313, 315

[56] References Cited

U.S. PATENT DOCUMENTS 5,008,566  4/1991  Hashimoto .......................... 327/581 X
5,301,161  4/1994  Landgraf et al. .............. 365/189.01 X Primary Examiner—Emanuel T. Voeltz
Assistant Examiner—Edward Pipala
Attorney, Agent, or Firm—Blakely, Sokoloff, Taylor & Zafman

[57] ABSTRACT

A voltage detector including first and second current paths between a source voltage at a first level and current-limiting device joined to a second level of voltage, each path including an essentially-identical flash EEPROM memory device, one of the memory devices being programmed to have a lower threshold voltage than the other memory device; a circuit for providing a voltage to be measured to gate terminals of one of the memory devices and a percent of the voltage to be measured to the of one of the memory devices having the lower threshold voltage, and an output device connected to measure the current flowing through one of the current paths, the output device being arranged to conduct when current through the first path is greater than current through the second path and not to conduct when current through the first path is less than current through the second path.

9 Claims, 3 Drawing Sheets

HIGH PRECISION VOLTAGE DETECTOR UTILIZING FLASH EEPROM MEMORY CELLS

BACKGROUND OF THE INVENTION

1. Field of the Invention

This invention relates to computer systems, and more particularly, to methods and apparatus for detecting one of two different input voltage levels provided as input to an integrated circuit.

2. History of the Prior Art

A major trend in the manufacture of personal computers is to provide portable computers which function for extended periods. This has led to attempts to reduce the power used by portable computers. In order to reduce power consumption and extend battery life, much of the integrated circuitry used in personal computers is being redesigned to run at lower voltage levels. This reduces the power usage and allows more components to be placed closer to one another in the circuitry. The circuitry and components used in portable computers are being designed to operate at voltages levels such as five volts. Certain components of portable computers are even being designed to run at even lower voltages such as three volts. These lower voltage levels help a great deal to reduce the power needs of such computers.

During this period of development of lower powered computers, many system designers are designing systems using all five volts components while others are designing systems using some components which operate with three volts and others which operate with five volts. Thus, a particular portable computer may have available both three and five volts sources. Because of the many different combinations of components available in the present market, it is desirable to provide circuitry which is capable of functioning in systems providing either or both five or three volt external sources.

One component which is finding wide use in portable computers the flash electrically-erasable programmable read-only memory (EEPROM) array. Flash EEPROM memory arrays may be used to provide a new form of long term random access storage which may replace electromechanical hard disk drives. An example of a flash EEPROM memory array which may be used in place of a hard disk drive is described in U.S. patent application Ser. No. 07/969,131, entitled *A Method and Circuitry For A Solid State Memory Disk*, S. Wells, filed Oct. 31, 1992, and assigned to the assignee of the present invention. Such an array provides a smaller lighter functional equivalent of a hard disk drive which operates more rapidly and is not as sensitive to physical damage. Such memory arrays are especially useful in portable computers where space is at a premium and weight is important. However, these flash EEPROM memory arrays also require much higher voltages for their operations than can be provided directly by the batteries of low powered portable computers.

In order to provide the higher voltages necessary to program and erase flash EEPROM memory arrays, charge pump circuitry is being utilized. Charge pumps typically increase voltage available by pumping the voltage to a higher level. In the typical case, a five volt external source is pumped to twelve volts to provide voltages for programming and erasing. Usually the five volts is sufficient for reading the array. However, designers of computers which have available a three volt source which may be pumped to five volts and used for reading the flash EEPROM memory array. Thus, in such circuits, it is necessary to know the level of voltage available in order to know whether to pump the external voltage to a higher value which may be used for reading the array. Many other purposes exist for the use of circuitry which provides an indication of a value of an external voltage so that circuitry may be optimized for use with the particular voltage. Moreover, it is especially desirable if the circuitry providing such an indication itself functions at very low power levels in order to enhance the power savings characteristics of a portable computer.

SUMMARY OF THE INVENTION

It is, therefore, an object of the present invention to provide circuitry for sensing the level of an external source of voltage so that the operation of the system may be optimized to function at that source voltage level.

It is another more specific object of the present invention to provide a method and apparatus for detecting the level of an external source of voltage so that circuitry for reading flash EEPROM memory arrays may be optimized for different possible levels of external source voltages.

These and other objects of the present invention are realized in a voltage detector comprising first and second current paths between a source voltage at a first level and a current-limiting device joined to a second level of voltage, each path including an essentially-identical flash EEPROM memory device, the memory device of the first path being programmed to have a higher threshold voltage than the memory device of the second path; a circuit for providing a voltage to be measured to the gate terminal of the memory device of the first path and a percent of the voltage to be measured to the gate terminal of the memory device of the second path, and an output device connected to compare the currents flowing through the current paths, the output device being arranged to conduct when current through the first path is greater than current through the second path and not to conduct when current through the first path is less than current through the second path.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
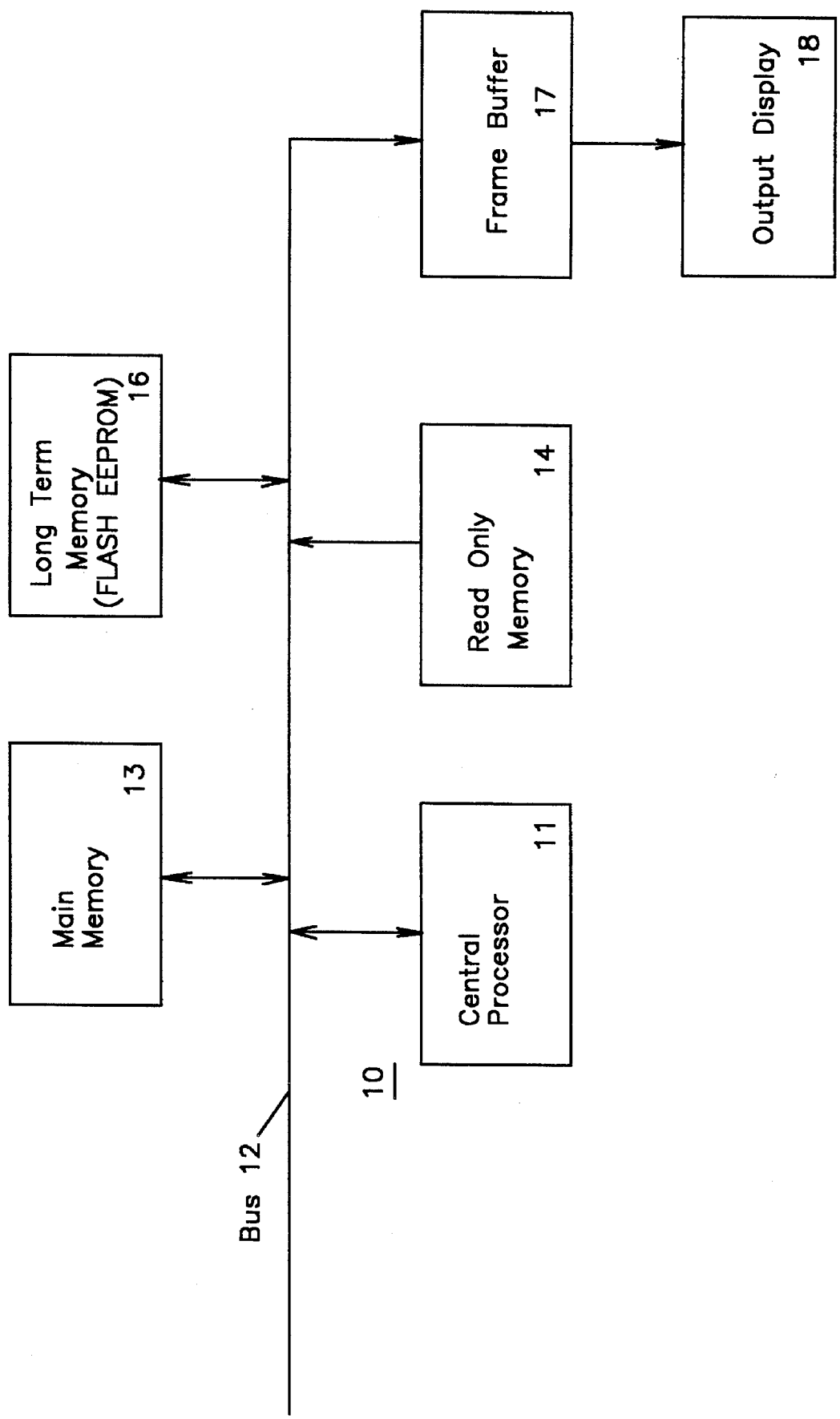
FIG. 1 is a block diagram of a computer system the elements of which may combine to provide the present invention.

Referring now to FIG. 1, there is illustrated a computer system 10. The system 10 includes a central processing unit 11 which executes the various instructions provided to the computer system 10 to control its operations. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes.

Also connected to the bus 12 various peripheral components such as long term memory 16 and circuitry such as a frame buffer 17 to which data may be written which is to be transferred to an output device such as a monitor 18 for display. Rather than the typical electro-mechanical hard disk drive which is typically used for long term memory, a flash EEPROM memory array may be used as the long term memory 16. Such flash EEPROM memory arrays are programmed and erased through techniques which utilize voltages greater than those typically available to the integrated circuits of more advanced portable computers. Such flash EEPROM memory arrays may include circuitry for programming and erasing the memory array. Consequently, such long term memory arrays may provide charge pump circuitry for generating higher voltages from the lower voltages provided by the batteries available in the portable computers in which such arrays are typically found.

A flash EEPROM memory array is made up of memory cells which include floating gate field effect transistor (FET) devices. Such memory transistors may be programmed to change the charge stored on the floating gate, and the condition (programmed or erased) may be detected by interrogating the cells. The conventional method of erasing an array of flash EEPROM memory cells erases all of the cells together (or at least some large block thereof). Typically, this requires the application of twelve volts to the source terminals of all of the memory cells, grounding the gate terminals, and floating the drain terminals. To read data stored in such a flash EEPROM memory array requires the application of five volts to the gate terminals of each of the memory transistors.

Figure 2:
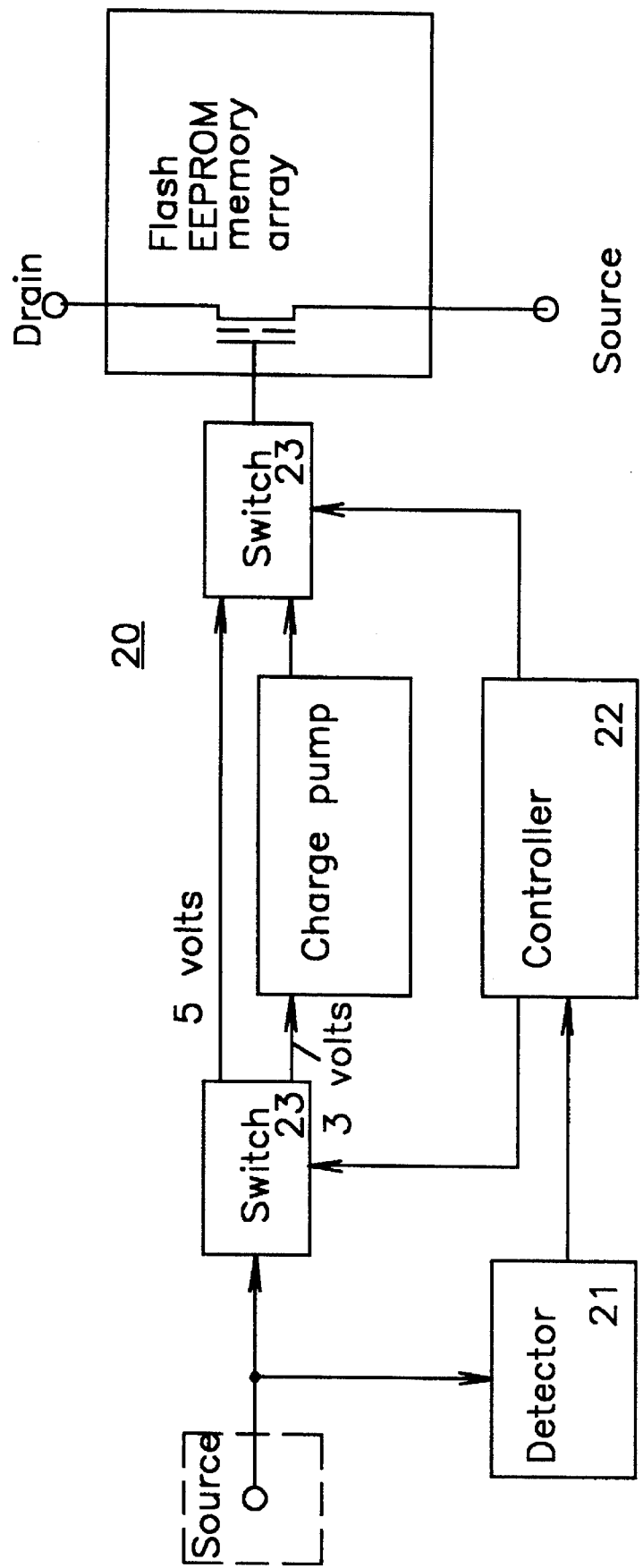
FIG. 2 is a block diagram of a circuit for detecting an external voltage level and operating various charge pump circuits depending on the level detected which may be used as a portion of the present invention.

Referring now to FIG. 2, there is illustrated a circuit 21 which may be a portion of the flash EEPROM memory array 16 of FIG. 1. The circuit 21 may be utilized to detect the level of voltage provided by an external source of voltage and control the application of voltage used for reading the array. The circuit includes a detector 21 joined to an input terminal at which a source of voltage is provided. In one embodiment, the source of voltage may provide either three or five volts. The detector 21 determines the value of voltage available and signals a control circuit 22. If the value of voltage available is five volts, then the input terminal is connected by a switching circuit 23 directly to circuitry leading to wordlines of a flash EEPROM memory array for reading the values stored therein. If, on the other hand, the value of voltage detected is three volts, then the input terminal is connected by the switch to supply the three volts at the input terminal to a charge pump circuit 25 designed to pump the input voltage value to a value of five volts which may be then transferred to the wordlines of the flash EEPROM memory array for reading values stored therein.

Figure 3:
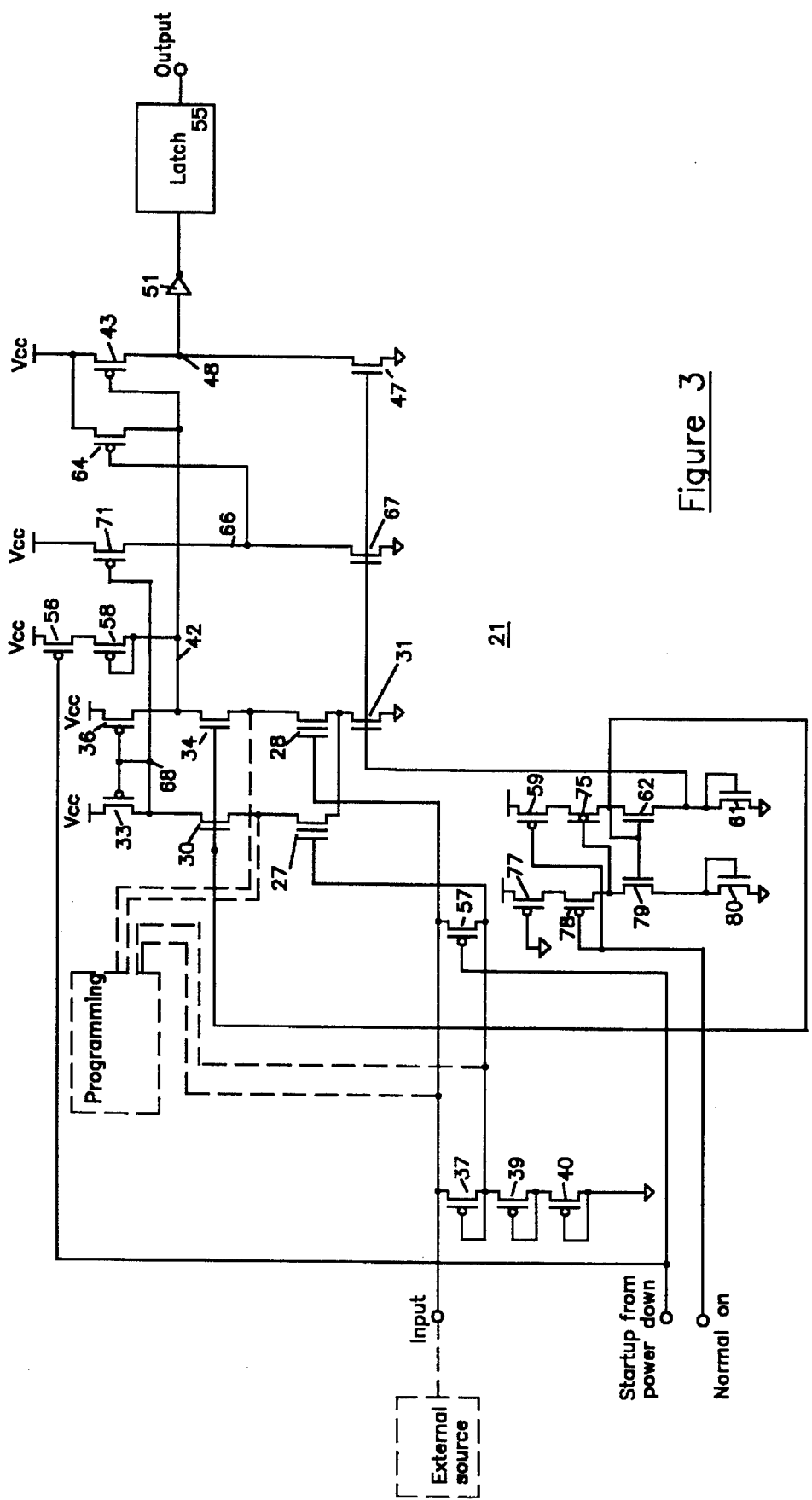
FIG. 3 is a block diagram of a voltage detector in accordance with the present invention

FIG. 3 illustrates one embodiment of a detector circuit 21 designed in accordance with the invention for determining which one of two different voltages (e.g., five or three volts in one embodiment) is provided to the circuit 21 from an external source of voltage. The circuit 21 includes a pair of flash EEPROM floating gate FET memory devices 27 and 28. The transistor devices 27 and 28 are essentially identical and are arranged in similar circuits between a source of potential Vcc and ground. The device 27 has a drain terminal connected to the source terminal of a N type FET device 30 used as a cascode device. A source terminal of the device 27 is connected to a drain terminal of a N type FET device 31 which has its source terminal joined to ground. The drain of the device 30 is joined to the drain of a P type FET device 33 which has its source joined to Vcc. Similarly, the device 28 has its source joined to drain of the device 31 and its drain connected to the source of another N type cascode FET device 34 which is connected through the source and drain terminals of a P type FET device 36 to Vcc.

The two identical devices 27 and 28 may be programmed in a well known manner so that they have different switching voltages Vt by varying the charge stored on the floating gate of each of the devices. Shown in dotted outline is a source of programming voltages used to apply voltages to the gate and drain terminals of the devices 27 and 28 in order to accomplish programming in a manner well known to those skilled in the art. By this programming, the device 27 is provided a 2.7 volt switching voltage Vt and the device 28 is provided a 4.0 volt switching voltage Vt in one embodiment of the invention.

In normal operation, the gate terminal of the device 28 is connected to receive the input voltage which is to be measured from a source of the input voltage Vcc. The gate terminal of the device 27 is connected between two P type FET devices 37 and 39 which are part of a voltage divider arrangement including also another P type device 40. The devices 37, 39, and 40 are essentially identical in one embodiment and are connected between Vcc and ground so that a voltage level of a value which is two-thirds the source voltage Vcc is furnished to the gate terminal of the device 27. Because of the programming by which different switching voltages are chosen for the devices 27 and 28 and the different values of the input voltages furnished to the gate terminals of the devices 27 and 28, the device 28 will transfer a higher current than the device 27 when the input voltage is greater than a value of four volts in one embodiment; and the device 27 will transfer a higher current than the device 28 when the input voltage is less than a value of four volts.

Presuming that the circuit 21 is on and operating in its normal range, if a voltage Vcc less than four volts is applied to input terminal of the circuit from the external source, the voltage at the gate terminal of the device 27 causes the current through the path through the device 27 to be high while the current through the path including the device 28 is lower. Alternatively, if the voltage Vcc at the input is higher than four volts, the current through the device 28 is larger than the current through the device 27.

The two device 33 and 36 have the same dimensions and, as may be seen, are connected in a current mirror arrangement with source terminals at Vcc and gate terminals joined together. Thus, the current flowing through the device 27 which flows through the device 33 is mirrored through the device 36. In order to maintain this current relationship, when a higher current is flowing through the device 28 than through the device 27, the voltage at a node 42 goes down. When a higher current is flowing through the device 27 than through the device 28, the voltage at the node 42 goes up. As will be seen, this voltage is measured by circuitry connected to the node 42 to provide an output signal indicating the value of the input voltage furnished from the source of input voltage Vcc.

A low voltage at the node 42 is applied to the gate terminal of a P type FET device 43 and turns that device on. The device 43 has its source terminal joined to Vcc. The drain terminal of the device 43 is joined to ground through a N type FET device 47. As will be seen, the device 47 is connected in another current mirroring arrangement with the N type device 31. Consequently, when the device 43 goes on, the controlled current through the device 47 causes the voltage at a node 48 to rise. The voltage at the node 48 is transferred through an inverters 51 and an output latch 55 to an output terminal. The inversion of the signal at the node 48 causes the original high valued signal to appear at the output of the circuit as a low valued signal. Thus, a value of Vcc higher than four volts causes the circuit 21 to generate a low valued output signal. It should be noted that the latch 55 is provided to retain an output which correctly reflects the level of the source voltage which has been measured when the circuit 21 is in a power down mode.

On the other hand, when the value of Vcc is less than four volts so that the device 27 is conducting a current greater than that conducted by the device 28, the value of the voltage at the node 42 remains too high to turn on the device 43. Consequently, the voltage at the node 48 remains low. This low value is transferred through the inverting device 51 to the latch 55 where it is furnished as a high valued signal at the output terminal. This high value at the output terminal indicates that the source voltage Vcc furnished from the external circuitry is low.

The circuit 21 includes several features which assists its operation. The circuit 21 is designed so that it may be operated in an arrangement which provides a deep power down mode in order to reduce power usage. In order to provide rapid turn-on from that deep power down mode, a P type FET device 57 is connected between the gate of the device 27 and the gate of the device 28. The device 57 is arranged to receive a value at its gate terminal when the circuit 21 is first taken out of deep power down mode so that the device 57 joins the two gate terminals of the devices 27 and 28 at the same input voltage. Additionally, a P type device 56 is enabled when the circuit is taken out of deep power down so that a P type FET device 58 chosen to have the same characteristics as the P type device 33 is initially on assuring that the voltage levels at the drain terminals of the cascode devices 30 and 34 are equal. A voltage divider arrangement including a P type FET device 59, a low threshold FET S or weak device 75 (having a very low threshold voltage), and a pair of N type FET devices 61 and 62 connected between ground and the source voltage Vcc determine the voltage at the gate terminals of the cascode devices 30 and 34. In this manner, the two devices 27 and 28 are brought rapidly to an equilibrium state when the circuit 21 is first brought out of deep power down so that a valid determination of the input voltage may be quickly furnished.

The circuit including the devices 59, 61, 62, and 75 also is arranged to be turned on very rapidly during a normal turn on of the circuit 21. To accomplish this, a current is established by a P type FET device 77 which has its source connected to Vcc and its gate grounded. When another P type device 78 is turned on, current through the device 77 is transferred to ground through a N type device 79 and another N type FET device 80. Current through the device 79 raises the voltage at its drain terminal and rapidly turns on the S type device 75. Since the S type device has little threshold voltage, the gate and drain terminals of the devices 79 and 62 are at essentially the same voltage providing a current mirror arrangement establishing current through the device 62. This helps to provide a very rapid turn on of the circuit 21.

In addition, a P type device 64 is joined between the source terminal of the output device 43 and its gate terminal. The device 64 has its gate terminal connected to a node 66. The node 66 is also joined to the drain of an N type FET device 67 connected with the devices 47, 31, and 61 in a current mirroring arrangement. A P type FET device 71 has its drain terminal connected to the node 66, its source terminal joined to Vcc during circuit operation, and its gate terminal connected to the node 68. The three devices 64, 67, and 71 form an out-of-range detection circuit which functions when the input level to the devices 27 and 28 is too low to provide proper results. For example, when the circuit 21 is first turned on and before either of the devices 27 or 28 turns on, the node 66 is held low by the current limiting device 67 thereby turning the device 64 on so that Vcc (at the source terminal of the device 43) is applied at the gate terminal of the device 43. This high value at the gate of the device 43 keeps the device 43 off and causes a value to appear at the output terminal of the circuit 21 signaling that a low value of source voltage Vcc is being furnished to the circuit. In this low range, the gate terminal of the device 71 is measuring the current through the device 27. When the circuit receives a sufficient value of Vcc at the input terminal to turn on the device 27 in its proper operating range, the node 68 goes low turning on the P type device 71. This raises the voltage at the gate of the device 64 so that the device 64 turns off and allows the output of the circuit 21 to be determined by the input voltage Vcc being measured.

Certain of the circuit elements are especially important in keeping the power utilized by the circuit 21 to a minimum. For example, the use of the N type device 31 in circuit with the two flash EEPROM devices 27 and 28 limits the dissipation of current through the testing portion of the circuit which remains on while the circuit is operating. The current limiting arrangement provided by the current mirroring from the device 61 through the devices 31, 67, and 47 enhances this feature and also reduces current dissipation at the output of the circuit 21 by controlling the current through the device 47.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A voltage detector comprising:
   a first current path including a first flash memory device programmed to a first switching voltage;
   a second current path including a second flash memory device programmed to a second switching voltage higher than the first switching voltage;
   a voltage divider network having an input node and an output node, the input node coupled to a source voltage at a first potential and to the second current path, the output node coupled to the first current path, the output node of the voltage divider network being at a predetermined fraction of the source voltage potential; and
   an output device, wherein the output device generates an output signal indicating when the current through the second current path is higher than the current through the first current path.

2. The voltage detector of claim 1 wherein the output device comprises a P-type FET device.

3. The voltage detector of claim 1 further comprising an out-of-range detection circuit coupled to the output device wherein when the source voltage is below a predetermined potential the out-of-range detection circuit generates an out-of-range signal.

4. A power supply voltage detection circuit for a flash EEPROM array comprising:
   a fast flash EEPROM floating gate memory device, the first EEPROM device having a drain terminal, a gate terminal and a source terminal, the first EEPROM device being programmed so as to have a first switching voltage;
   a second flash EEPROM floating gate memory device, the second EEPROM device having a drain terminal, a gate terminal and a source terminal, the second EEPROM device being programmed so as to have a second switching voltage higher than the first switching voltage;
   a first N-type FET device, the first N-type FET device having a drain terminal and a source terminal, the source terminal of the first N-type FET device being coupled to the drain terminal of the first flash EEPROM device;
   a second N-type FET device, the second N-type FET device having a drain terminal and a source terminal, the source terminal of the second N-type FET device being coupled to the drain terminal of the second flash EEPROM device;
   a third N-type FET device, the third N-type FET device having a drain terminal and a source terminal, the drain terminal of the third N-type FET device being coupled to the source terminal of the first flash EEPROM device and further coupled to the source terminal of the second flash EEPROM device, the source terminal of the N-type FET device being coupled to a first node, the first node at ground potential;
   a first P-type FET device, the first P-type FET device having a drain terminal, a gate terminal and a source terminal, the source terminal of the first P-type FET device being coupled to a second node, the second node at operating voltage potential, the drain of the first P-type FET device being coupled to the drain of the first N-type FET device;
   a second P-type FET device, the second P-type FET device having a drain terminal, a gate terminal and a source terminal, the source terminal of the second P-type FET device being coupled to the second node, the drain terminal of the second P-type FET device being coupled to the drain terminal of the second N-type FET device, the gate terminal of the second P-type FET device being coupled to the gate terminal of the first P-type FET device and to the drain terminal of the first N-type FET device, the interconnection of the gate terminal of the first P-type FET device, the gate terminal of the second P-type FET device and the drain terminal of the first N-type FET device comprising a third node; and
   a voltage divider network, the voltage divider network having an input node and an output node, the input node being coupled to an external voltage potential and further being coupled to the gate terminal of the second flash EEPROM device, the output terminal being coupled to the gate terminal of the first flash EEPROM device,
   wherein when the external voltage potential is equal to or greater than the second switching voltage, the second flash EEPROM device transfers a higher current than the first flash EEPROM device and when the external voltage potential is lower than the second switching voltage, the first flash EEPROM device transfers a higher current than the second flash EEPROM device.

5. The power supply voltage detection circuit of claim 4 further comprising an output device, the output device coupled to the drain terminal of the second N-type FET device, the output device arranged to conduct when the second flash EEPROM device transfers a higher current than the first flash EEPROM device and not to conduct when the first flash EEPROM device transfers a higher current than the second flash EEPROM device.

6. The power supply voltage detection circuit of claim 5 wherein the output device comprises a third P-type FET device.

7. The power supply voltage detection circuit of claim 5 further comprising an out-of-range detection circuit, the out-of-range detection circuit comprising:
   a fourth P-type FET device, the fourth P-type FET device having a drain terminal, a source terminal coupled to the second node, and a gate terminal coupled to the third node;
   a fourth N-type FET device, the fourth N-type FET device having a source terminal coupled to the first node and a drain terminal coupled to the drain terminal of the fourth P-type FET device; and
   a fifth P-type FET device, the fifth P-type FET device having a gate terminal coupled to the drain terminal of the fourth P-type FET device, a source terminal coupled to the second node and a drain terminal coupled to the output device.

8. The power supply voltage detection circuit of claim 4 further comprising a circuit for rapidly equalizing the current through the first and second flash EEPROM devices upon initialization.

9. A method of detecting the level of a voltage comprising the steps of:

programming a first flash memory device to a first switching voltage and a second flash memory device to a second switching voltage higher than the first switching voltage;

providing the voltage to the input terminal of a voltage divider network and to a first current path including the second flash memory device;

providing an output of the voltage divider network to a second current path including the first flash memory device, the output of the voltage divider network comprising a predetermined fraction of the voltage;

measuring the current flow through the first and second current paths; and generating an output signal indicating when the current through the first current path is higher than the current through the second current path.

* * * * *